United States Patent
Yoon

(10) Patent No.: US 7,616,049 B2
(45) Date of Patent: Nov. 10, 2009

(54) PUMPING VOLTAGE GENERATING APPARATUS OF SEMICONDUCTOR INTEGRATED CIRCUIT

(75) Inventor: Hyuck-Soo Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 156 days.

(21) Appl. No.: 11/826,666

(22) Filed: Jul. 17, 2007

(65) Prior Publication Data

US 2008/0111612 A1    May 15, 2008

(30) Foreign Application Priority Data

Nov. 13, 2006    (KR) ............... 10-2006-0111438

(51) Int. Cl.
*G05F 1/10* (2006.01)
(52) U.S. Cl. .......................... 327/536; 363/60
(58) Field of Classification Search ................. 327/536, 327/537; 363/59, 60
See application file for complete search history.

(56) References Cited

U.S. PATENT DOCUMENTS

| 5,059,815 | A | * | 10/1991 | Bill et al. ................ 327/536 |
|---|---|---|---|---|
| 6,268,761 | B1 | * | 7/2001 | Naganawa ............... 327/536 |
| 6,504,783 | B2 | | 1/2003 | Jo |
| 6,522,193 | B2 | * | 2/2003 | Shin ....................... 327/536 |
| 7,227,403 | B2 | * | 6/2007 | Kim ....................... 327/536 |
| 7,310,014 | B2 | * | 12/2007 | Lee et al. ................ 327/536 |
| 7,349,268 | B2 | * | 3/2008 | Hwang et al. ......... 365/189.11 |
| 2007/0236278 | A1 | * | 10/2007 | Hur et al. ................ 327/536 |
| 2008/0116958 | A1 | * | 5/2008 | Ko et al. ................. 327/536 |

FOREIGN PATENT DOCUMENTS

| JP | 07-296583 | 11/1995 |
|---|---|---|
| JP | 2002170387 | 6/2002 |
| KR | 1020010028064 | 4/2001 |
| KR | 1020020050107 | 6/2002 |
| KR | 1020030002731 | 1/2003 |

* cited by examiner

*Primary Examiner*—Lincoln Donovan
*Assistant Examiner*—Patrick O'Neill
(74) *Attorney, Agent, or Firm*—Venable LLP; Jeffri A. Kaminski

(57) ABSTRACT

A pumping voltage generating apparatus includes a detection signal generating unit that generates a detection signal when a pumping voltage is lower than a reference value. A pumping unit elevates a first external voltage by a second external voltage to be output as the pumping voltage, in response to the detection signal. In this case, the second external voltage is lower than the first external voltage.

18 Claims, 2 Drawing Sheets

PUMPING VOLTAGE GENERATING APPARATUS OF SEMICONDUCTOR INTEGRATED CIRCUIT

CROSS-REFERENCE TO RELATED PATENT APPLICATION

This application claims the benefit of Korean Patent Application No. 10-2006-0111438, filed on Nov. 13, 2006, in the Korean Intellectual Property Office, the disclosure of which is incorporated herein in its entirety by reference.

BACKGROUND OF THE INVENTION

1. Technical Field

The present invention relates to a semiconductor integrated circuit, and in particular, to a pumping voltage generating apparatus of a semiconductor integrated circuit.

2. Related Art

A semiconductor integrated circuit, for example, a semiconductor memory apparatus requires a voltage that is higher than an external voltage VDD in order to be sufficiently driven, and such a high voltage is generated by pumping the external voltage. Recently, a semiconductor memory apparatus having low current consumption has been developed with the trend in reducing the external voltage level. For this reason, a larger amount of pumping an external voltage is required to generate a high voltage. When the amount of pumping is increased, the current consumption of the semiconductor integrated circuit is correspondingly increased, which results in an increase in the size of a pumping circuit.

Recently, separate power for generating a pumping voltage supplied from the outside is provided to the semiconductor memory apparatus in order to generate a pumping voltage (hereinafter, external pumping voltage). Further, an internal pumping voltage that is almost as twice as much the external pumping voltage is generated by pumping the external pumping voltage, and a general pumping voltage is generated by dropping the external pumping voltage.

However, the internal pumping voltage that is almost as twice as much the external pumping voltage may cause a stress in the semiconductor integrated circuit, especially, a semiconductor memory apparatus. Further, stress may affect a burn-in test process, which may cause a defective semiconductor integrated circuit and malfunction of a circuit, and as a result, reliability is reduced.

SUMMARY OF THE INVENTION

An embodiment of the present invention provides a pumping voltage generating apparatus of a semiconductor integrated circuit that is capable of reducing the amount of pumping and the size of a pumping circuit.

Another embodiment of the present invention provides a pumping voltage generating apparatus of a semiconductor integrated circuit that is capable of reducing the amount of pumping, the size of a pumping circuit and stress.

According to an embodiment of present invention, there is provided a pumping voltage generating apparatus of a semiconductor integrated circuit that includes a detection signal generating unit that generates a detection signal when a pumping voltage is lower than a reference value; and a pumping unit that elevates a first external voltage by a second external voltage to be output as the pumping voltage, in response to the detection signal. In this case, the second external voltage may be lower than the first external voltage.

According to another embodiment of present invention, there is provided a pumping voltage generating apparatus of a semiconductor integrated circuit that includes a pumping unit that generates a pumping voltage in response to a detection signal generated by comparing the pumping voltage and a reference voltage; and a voltage selecting unit that selectively outputs the pumping voltage or a first external voltage in response to a control signal.

According to still another embodiment of present invention, there is provided a pumping voltage generating apparatus of a semiconductor integrated that includes a detection signal generating unit that generates a detection signal in response to information that compares an initial pumping voltage and a reference voltage; and a voltage generating unit that generates a pumping voltage using a total of a first external voltage and a second external voltage in response to the detection signal and selectively outputs the pumping voltage or the first external voltage in response to the control signal, the second external voltage being lower than the first external voltage.

DESCRIPTION OF EXEMPLARY EMBODIMENT

Embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
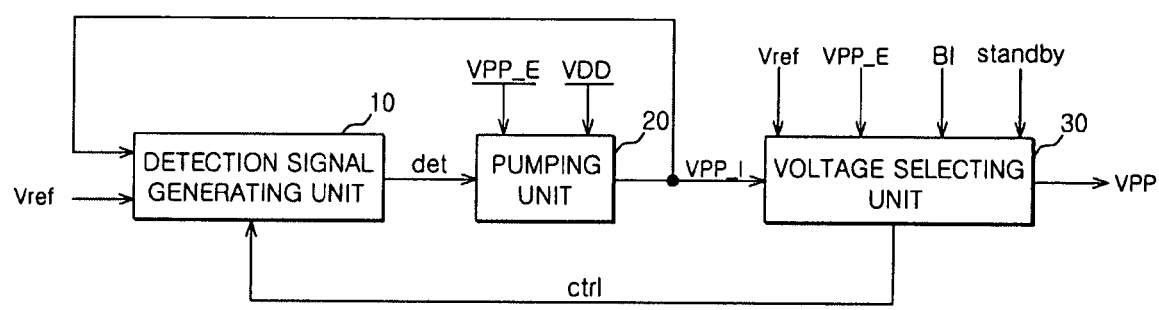
FIG. 1 is a block diagram showing a pumping voltage generating apparatus according to an embodiment of the present invention.

Referring to FIG. 1, a pumping voltage generating apparatus according to an embodiment of the invention includes a detection signal generating unit 10, a pumping unit 20, and a voltage selecting unit 30.

The detection signal generating unit 10 generates a detection signal det in response to information that compares a feedback pumping voltage VPP_I, a reference voltage Vref, and a control signal ctrl.

The pumping unit 20 pumps a second external voltage VDD in response to the detection signal det, and elevates a first external voltage VPP_E by a pumping amount of the second external voltage VDD, to output an internal pumping voltage VPP_I. That is, the internal pumping voltage has a voltage level that sums the first external voltage level and the pumping amount of the second external voltage.

The voltage selecting unit 30 generates the control signal ctrl that is enabled when the first external voltage VPP_E is higher than the reference voltage Vref or during the burn-in test or stand-by mode, and outputs the first external voltage VPP_E or the internal pumping voltage VPP_I in response to the control signal ctrl.

Figure 2:
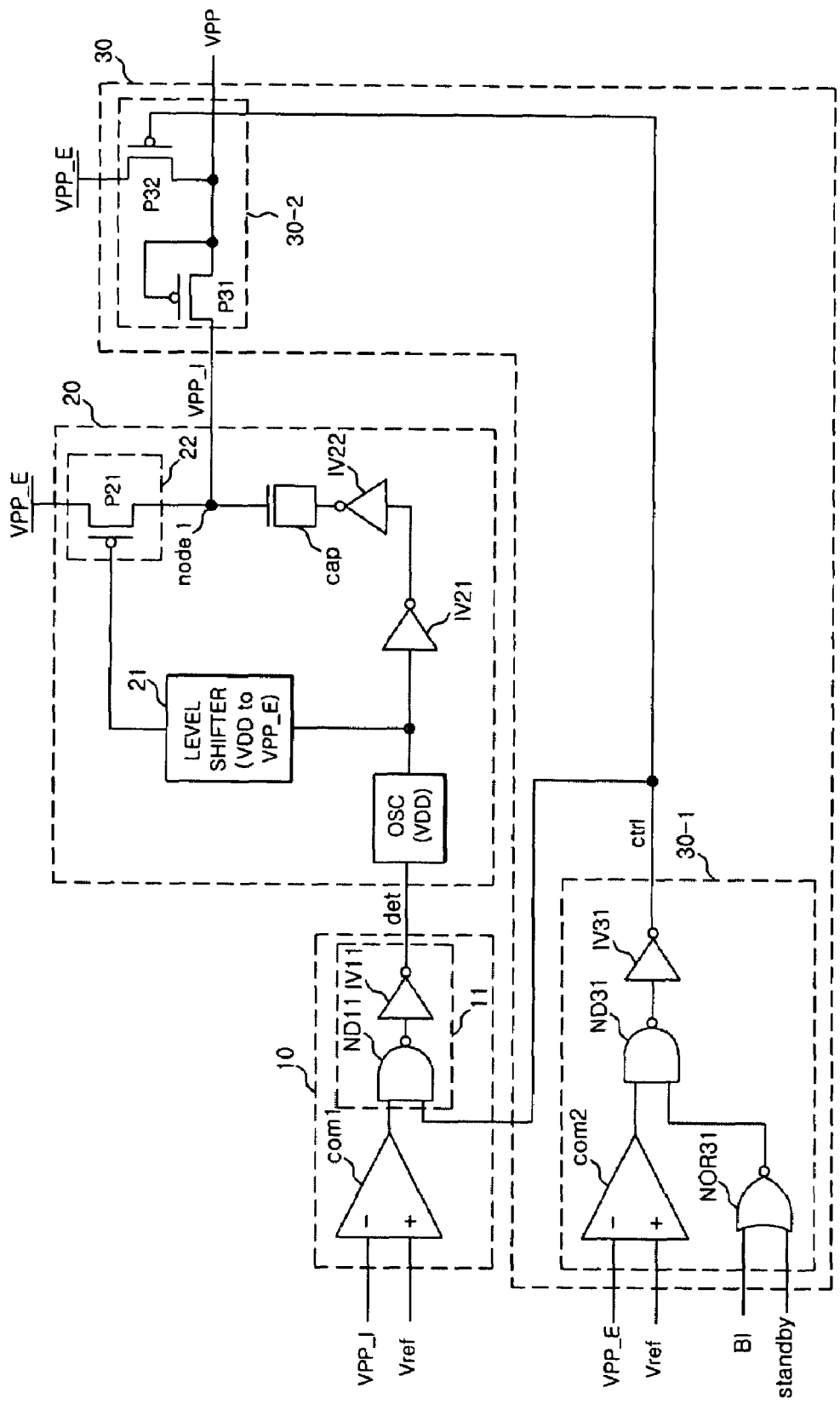
FIG. 2 is a detailed block diagram showing the pumping voltage generating apparatus according to an embodiment of the present invention.

The detailed configuration of the pumping voltage generating apparatus according to an embodiment of the invention will be described with reference to FIG. 2. In FIG. 2, a comparator com2 may compare the first external voltage VPP_E or the pumping voltage VPP_I with the reference voltage Vref for the convenience of description. However, when realizing the actual circuit, the level of a first external voltage VPP_E or the pumping voltage VPP_I may be decreased so as to correspond the level of the reference voltage Vref and then the decreased first external voltage VPP_E or the decreased pumping voltage VPP_I may be compared with the reference voltage Vref.

The detection signal generating unit 10 includes a comparator com1 that compares the pumping voltage VPP_I with the reference voltage Vref, and a signal generating unit 11 that generates the detection signal det using an output signal from the first comparator com1 and the control signal ctrl as an input. The signal generating unit 11 includes a NAND gate ND11 to which the output signal from the first comparator com1 and the control signal ctrl are input, and a first inverter IV11 that inverts an output signal of the NAND gate ND11 to generate the detection signal det. If the voltage selecting unit 30 is not used, the signal generating unit 11 is also not used, and the output signal of the first comparator com1 serves as the detection signal det. The first comparator com1 outputs a high level signal when the pumping voltage VPP_I is lower than the reference voltage Vref, and outputs a low level signal when the pumping voltage VPP_I is higher than the reference voltage Vref.

The pumping unit 20 elevates the first external voltage VPP_E by a level of the second external voltage VDD in response to the detection signal det. Here, the first external voltage VPP_E refers to a voltage that is applied from the outside and has a normal pumping voltage level. Further, the second external voltage VDD refers to a voltage that is applied from the outside and has an external voltage level suitable for the semiconductor memory apparatus. Therefore, the first external voltage VPP_E may be higher than the second external voltage VDD.

The pumping unit 20 includes an oscillator osc, a second inverter IV21 and a third inverter IV22, a pumping capacitor cap, a level shifter 21, and a voltage supplier 22. The oscillator osc receives the detection signal det to output an oscillation signal. The oscillator osc uses the second external voltage VDD as a driving voltage. The second inverter IV21 inverts an output signal of the oscillator osc and the third inverter IV22 inverts an output signal of the second inverter IV21. Specifically, the second and third inverters IV21 and IV22 buffer the output signal of the oscillator osc. The pumping capacitor cap receives an output signal of the third inverter IV22 to pump the output signal of the third inverter IV22. When the oscillator is enabled, the pumping capacitor cap supplies a high level that is the output signal of the third inverter IV22, to the output node node 1 of the pumping unit 20. In this embodiment, if the pumping capacitor cap includes a single capacitor, the pumping capacitor cap bootstraps the voltage of the node 'node 1' by the output signal of the third inverter IV22. Otherwise, if the pumping capacitor cap includes a plurality of capacitors, the pumping capacitor cap continuously supplies the output signal of the third inverter IV22 to the node node 1.

The voltage supplier 22 outputs the first external voltage VPP_E in response to the output signal of the level shifter 21. The voltage supplier 22 may include a first transistor P21 having a gate to which the output signal of the level shifter 21 is input, a source to which the first external voltage VPP_E is applied, and a drain to which the output voltage of the pumping capacitor cap, that is, the second external voltage VDD is applied. Here, the output node 'node 1' of the pumping unit 20 is disposed at a portion at which the voltage supplier 22 and the pumping capacitor cap are connected, and the output voltage of the voltage supplier 22 and the output voltage of the pumping capacitor cap are supplied to the output node 'node 1' of the pumping unit 20 to output as the pumping voltage VPP_I.

The voltage selecting unit 30 generates a control signal ctrl that is enabled when the first external voltage VPP_E is higher than the reference voltage Vref, or during the burn-in test or a stand-by mode. Further, the voltage selecting unit 30 outputs the pumping VPP_I or the first external voltage VPP_E as an output voltage VPP in response to the control signal ctrl. In this case, the control signal ctrl is input to the detection signal generating unit 10. The detection signal generating unit 10 makes the detection signal det disabled when the control signal ctrl is enabled, and turns off the pumping unit 20.

The voltage selecting unit 30 may include a control signal generator 30-1 and a voltage output section 30-2. The control signal generator 30-1 generates a control signal ctrl that is enabled at a low level when the first external voltage VPP_E is higher than the reference voltage Vref, or during the burn-in test or a stand-by mode.

The control signal generator 30-1 may include a second comparator com2 that compares the first external voltage VPP_E and the reference voltage Vref, a NOR gate NOR31 that uses the burn-in test entry signal BI and a standby mode entry signal standby as an input, a NAND gate ND31 that receives an output signal of the NOR gate NOR 31 and an output signal of the second comparator com2, and an inverter IV31 that inverts the output signal of the NAND gate ND31 to output the control signal ctrl. The control signal ctrl is enabled at a low level when the external voltage VPP_E is higher than the reference voltage Vref, or the burn-in test entry signal BI is enabled at a high level, or the stand-by mode entry signal standby is enabled at a high level.

The voltage output section 30-2 selectively outputs the pumping voltage VPP_I or the first external voltage VPP_E in response to the control signal ctrl. The voltage output section 30-2 may include a second transistor P32 having a gate to which the control signal ctrl is input and a source to which the first external voltage VPP_E is applied, and a third transistor P31 having a source to which the pumping voltage VPP_I is applied and a gate and a drain that are commonly connected to the drain of the first transistor. In this case, the output terminal of the voltage output section 30-2 is a node at which the second transistor P32 and the third transistor P31 are connected.

The operation of the pumping voltage generating circuit of the semiconductor memory apparatus according to an embodiment of the invention will be described.

The first comparator com1 of the detection signal generating unit 10 outputs a high level signal when the pumping voltage VPP_I is lower than the reference voltage Vref, and outputs a low level signal when the voltage VPP_I is higher than the reference voltage Vref. The output signal of the first comparator com1 may be an output signal of the detection signal generating unit 10. That is, the detection signal generating unit 10 generates a detection signal det that is enabled at a high level when the pumping voltage VPP_I is lower than the reference voltage Vref, and generates a detection signal that is disabled at a low level when the pumping voltage VPP_I is higher than the reference voltage Vref.

When the detection signal det is at a high level, the oscillator osc of the pumping unit 20 generates a signal that periodically oscillates. Since the oscillator osc is driven on the basis of the second external voltage VDD, the high level output signal of the oscillator osc corresponds to a level of the second external voltage VDD, and a low level output signal corresponds to a ground level.

When the oscillator osc generates a signal, the pumping capacitor cap pumps and outputs the second external voltage VDD. The level shifter 21 shifts the high level output signal of the oscillator osc from the second voltage level to the first external voltage level.

When the output signal of the level shifter 21 is at a low level, the voltage supplier 22 supplies the first external voltage VPP_E to the node 'node 1'. The node 'node 1' is supplied with both the first external voltage VPP_E and the output voltage of the pumping capacitor cap (for example, the second external voltage VDD) to output a total of the first external voltage VPP_E and the output voltage of the pumping capacitor cap as the pumping voltage VPP_I. Since the pumping capacitor cap may have a leakage, the value supplied from the pumping capacitor cap may be an average of the high level and the low level.

However, if the detection signal det is at a low level, the pumping unit 20 does not operate.

When the voltage selecting unit 30 is provided, the second comparator com2 of the control signal generating section 30-1 of the voltage selecting unit 30 outputs a low level signal when the first external voltage VPP_E is higher than the reference voltage Vref, and outputs a high level signal when the first external voltage VPP_E is lower than the reference voltage Vref. In this case, the NOR gate NOR31 outputs a low level signal when any one of the burn-in test entry signal BI and the stand-by mode entry signal standby is enabled at a high level. Therefore, the NOR gate NOR31 outputs a high level signal when both the burn-in test entry signal BI and the stand-by mode entry signal standby are disabled at a low level.

The control signal generating section 30-1 determines whether the control signal ctrl is activated according to the output signal of the second comparator com2 when the NOR gate NOR31 outputs a high level signal, that is, when both the burn-in test entry signal BI and the stand-by mode entry signal standby are disabled. In this case, the second comparator com2 outputs a low level signal when the first external voltage VPP_E is higher than the reference voltage Vref so that the control signal ctrl becomes a signal that is enabled at a low level. In the meantime, the control signal ctrl is enabled at a low level when any one of the burn-in test entry signal BI and the stand-by mode entry signal standby is enabled at a high level.

The control signal generating section 30-1 outputs the control signal ctrl that is enabled at a low level when the first external voltage VPP_E is higher than the reference voltage Vref or the burn-in test entry signal BI is enabled or the stand-by mode entry signal standby is enabled.

If the voltage selecting unit 30 is provided, the detection signal generating unit 10 includes the signal generating unit 11. The signal generating unit 11 outputs the low level signal when any one of the input signals is at a low level. Therefore, when the control signal ctrl that is enabled at a low level is input to the detection signal generating unit 10, the detection signal det is disabled at a low level. When the detection signal det is enabled at a low level, the pumping unit 20 does not drive.

In this case, when the control signal ctrl that is enabled at a low level is input to the voltage output section 30-2, the third transistor P32 is turned on and the first external voltage VPP_E is output as an output voltage VPP of the pumping voltage generating circuit.

Further, when the first external voltage VPP_E is lower than the reference voltage Vref, and the device is neither in the burn-in test mode nor the stand-by mode, the control signal generating section 30-1 outputs the control signal ctrl that is disabled at a high level. The detection signal generating unit 10 receives the control signal ctrl that is disabled at a high level. Accordingly, the detection signal generating unit 10 generates the detection signal det that is disabled at a low level when the pumping voltage VPP_I is higher than the reference voltage Vref. The pumping unit 20 is turned off, and the voltage output section 30-2 stops outputting the first external voltage VPP_E. Meanwhile, the detection signal generating unit 10 generates the detection signal det that is enabled at a high level when the pumping voltage VPP_I is lower than the reference voltage Vref. Therefore, the pumping unit 20 is turned on to generate the pumping voltage VPP_I, and the voltage output section 30-2 outputs the pumping voltage VPP_I.

According to an embodiment of the present invention, a pumping voltage that is supplied from the outside is pumped with an external voltage that is lower than the pumping voltage. Therefore, it is possible to generate an internal pumping voltage that is lower than twice the external pumping voltage. As a result, it is further possible to reduce the stress of the semiconductor integrated circuit caused by pumping a voltage.

Further, since an additional voltage drop circuit is not needed, it is possible to increase available space in the semiconductor integrated circuit and to reduce the current consumption by stopping the pumping operation in the stand-by mode.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A pumping voltage generating apparatus of a semiconductor integrated circuit, the apparatus comprising:
   a detection signal generating unit that generates a detection signal when a pumping voltage is lower than a reference voltage; and
   a pumping unit that elevates a first external voltage by a second external voltage to be output as the pumping voltage, in response to the detection signal; and
   a voltage selecting unit that selectively outputs the pumping voltage or the first external voltage in response to a control signal,
   wherein the second external voltage is lower than the first external voltage.

2. The apparatus of claim 1, wherein the pumping unit includes:
   an oscillator that is driven in response to the detection signal and uses the second external voltage as a driving voltage to provide an output signal; and
   a pumping capacitor that receives the output signal of the oscillator to bootstrap a voltage of an output node by the second external voltage.

3. The apparatus of claim 1, wherein the pumping unit includes:
   an oscillator that is driven in response to the detection signal and uses the second external voltage as a driving voltage to provide an output signal;
   a circuit that buffers the output signal of the oscillator to provide a buffered output signal;

a pumping capacitor that receives the buffered output signal of the oscillator to pump up to the second external voltage;

a level shifter that shifts the output signal of the oscillator to the first voltage level to provide an output signal; and a voltage supplier that outputs the first external voltage in response to the output signal of the level shifter, wherein a node at which the voltage supplier and the pumping capacitor are connected is an output terminal of the pumping unit.

4. The apparatus of claim 1, wherein the detection signal generating unit generates the detection signal which is enabled at a high level when the pumping voltage is lower than the reference voltage.

5. The apparatus of claim 4, wherein the detection signal generating unit includes:

a comparator that compares the pumping voltage and the reference voltage to generate the detection signal.

6. The apparatus of claim 1, wherein the voltage selecting unit that generates the control signal that is enabled when the first external voltage is higher than the reference voltage or during a burn-in test or a stand-by mode, controls the detection signal generating unit.

7. The apparatus of claim 6, wherein the voltage selecting unit includes:

a control signal generating unit that generates the control signal which is enabled when the first external voltage is higher than the reference voltage or during the burn-in test or stand-by mode, and a voltage supplier that selectively outputs the first external voltage or the pumping voltage in response to the control signal.

8. The apparatus of claim 6, wherein the detection signal generating unit disables the detection signal when the control signal is enabled.

9. The apparatus of claim 1, wherein the detection signal generating unit includes:

a comparator that compares the pumping voltage and the reference voltage to provide an output signal; and a signal generating unit that receives the output signal of the comparator and a control signal, wherein the signal generating unit outputs the detection signal.

10. A pumping voltage generating apparatus of a semiconductor integrated circuit, comprising:

a pumping unit that generates a pumping voltage in response to a detection signal generated by comparing the pumping voltage and a reference voltage; and a voltage selecting unit that selectively outputs the pumping voltage or a first external voltage in response to a control signal, wherein the pumping unit includes;

an oscillator that responds to the detection signal and is driver by a second external voltage to provide an output signal;

first and second inverters that use the output signal of the oscillator as an input and provide outputs based thereon;

a level shifter that shifts the output signal of the oscillator to the first external voltage level to provide an output signal;

a pumping capacitor that pumps the second external voltage using the outputs of the first and second inverters as an input; and a voltage supplier that outputs the first external voltage in response to the output signal of the level shifter, and a node at which the voltage supplier and the pumping capacitor are connected is an output terminal of the pumping unit.

11. The apparatus of claim 10, wherein the control signal is enabled when the first external signal is higher than the reference voltage or during a burn-in test or a stand-by mode.

12. The apparatus of claim 10, further comprising:

a detection signal generating unit that generates the detection signal by comparing the pumping voltage and the reference voltage.

13. The apparatus of claim 12, wherein when the enabled control signal is input to the detection signal generating unit, the detection signal generating unit outputs the detection signal which is disabled regardless of the comparison of the pumping voltage and the reference voltage.

14. A pumping voltage generating apparatus of a semiconductor integrated circuit, comprising:

a detection signal generating unit that generates a detection signal in response to a comparison of an initial pumping voltage and a reference voltage; and a voltage generating unit that generates a pumping voltage using a total of a first external voltage and a second external voltage in response to the detection signal and selectively outputs the pumping voltage or the first external voltage in response to a control signal, wherein the second external voltage being lower than the first external voltage.

15. The apparatus of claim 14, wherein the voltage generating unit generates the control signal that is enabled when the first external voltage is higher than the reference voltage or during a burn-in test or a stand-by mode.

16. The apparatus of claim 15, wherein the voltage generating unit generates the control signal which is disabled when the first external voltage is lower than the reference voltage or during the burn-in test or the stand-by mode.

17. The apparatus of claim 15, wherein the voltage generating unit includes;

a pumping unit that generates the pumping voltage; and a voltage selecting unit that outputs the pumping voltage or the first external voltage in response to the control signal.

18. The apparatus of claim 17, wherein the pumping unit includes:

a pumping capacitor that pumps the second external voltage at an output node of the pumping unit to which the first external is supplied.

* * * * *